(12) United States Patent
Priewasser et al.

(10) Patent No.: US 7,087,502 B2
(45) Date of Patent: Aug. 8, 2006

(54) METHOD FOR GENERATING CHIP STACKS

(75) Inventors: Karl Heinz Priewasser, Kirchheim (DE); Sylvia Winter, Laussintz (DE)

(73) Assignees: Disco Hi-Tec Europe GmbH, Kirchheim (DE); Infineon Technologies AG, Munich (DE)

( * ) Notice: Subject to any disclaimer, the term of this patent is extended or adjusted under 35 U.S.C. 154(b) by 0 days.

(21) Appl. No.: 10/944,394

(22) Filed: Sep. 16, 2004

(65) Prior Publication Data
US 2005/0095733 A1    May 5, 2005

(30) Foreign Application Priority Data
Sep. 17, 2003  (DE) ................ 103 42 980

(51) Int. Cl.
*H01L 21/46* (2006.01)
*H01L 21/78* (2006.01)
*H01L 21/301* (2006.01)

(52) U.S. Cl. ................ 438/464; 438/118; 438/114; 438/977; 438/460; 438/455; 438/458; 438/459; 257/686; 361/790

(58) Field of Classification Search ........... 438/14, 438/15, 17.107, 109, 113, 118, 119, 455, 438/458, 459, 460, 464, 977, 4, 114, 689–757, 438/759, 959; 257/686, 700, E25.013, 777, 257/620, 622; 324/765; 361/783
See application file for complete search history.

(56) References Cited

U.S. PATENT DOCUMENTS

| | | | | |
|---|---|---|---|---|
| 5,547,906 A | * | 8/1996 | Badehi | 438/109 |
| 5,747,101 A | * | 5/1998 | Booth et al. | 438/460 |
| 5,872,025 A | * | 2/1999 | Cronin et al. | 438/109 |
| 5,918,363 A | | 7/1999 | George et al. | |
| 6,040,204 A | * | 3/2000 | Herden et al. | 438/109 |
| 6,159,323 A | | 12/2000 | Joly et al. | |
| 6,806,494 B1 | * | 10/2004 | Fenner et al. | 257/48 |

FOREIGN PATENT DOCUMENTS

| | | |
|---|---|---|
| DE | 4433845 A1 | 3/1996 |
| DE | 19856573 C1 | 5/2000 |
| WO | WO 01/18851 A1 | 3/2001 |
| WO | WO 01/29881 A2 | 4/2001 |

* cited by examiner

*Primary Examiner*—Matthew Smith
*Assistant Examiner*—John M. Parker

(57) ABSTRACT

Disclosed is a method for generating chip stacks during the production of chips from wafers, the chips located on the wafer being separated from one another, the wafer being ground thin and the chips being stacked to form chip stacks, the chips being checked for the purpose of a functional check, characterized in that the chips are checked in a first work step, that adhesive material is applied on the good chips, whereas the bad chips are not provided with adhesive material, that the wafer is assembled and ground thin afterwards and that the bad chips are subsequently removed and replaced by good chips.

6 Claims, 3 Drawing Sheets

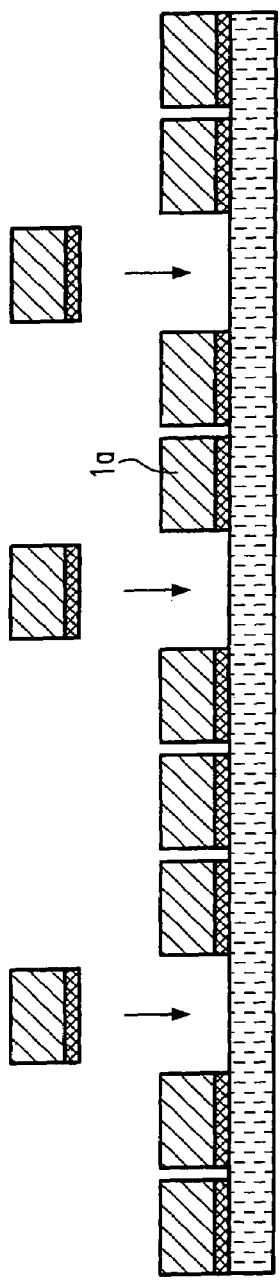
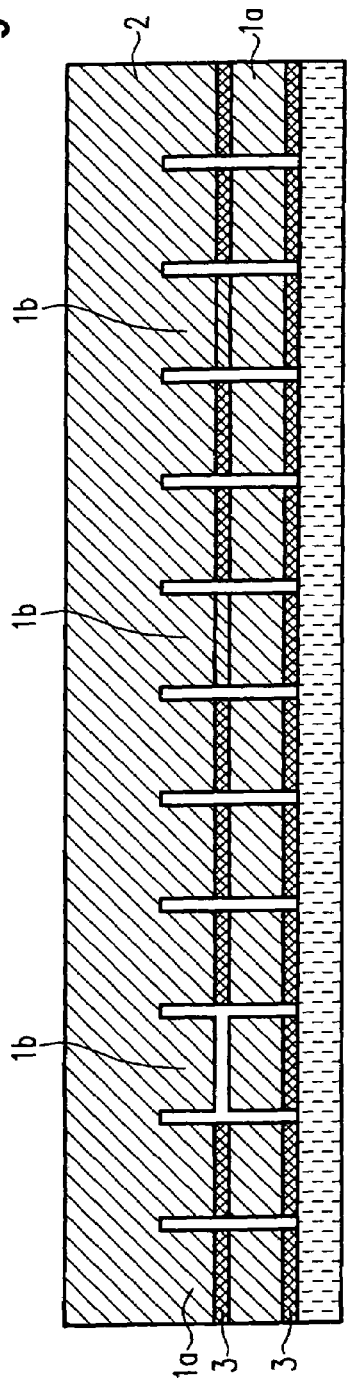
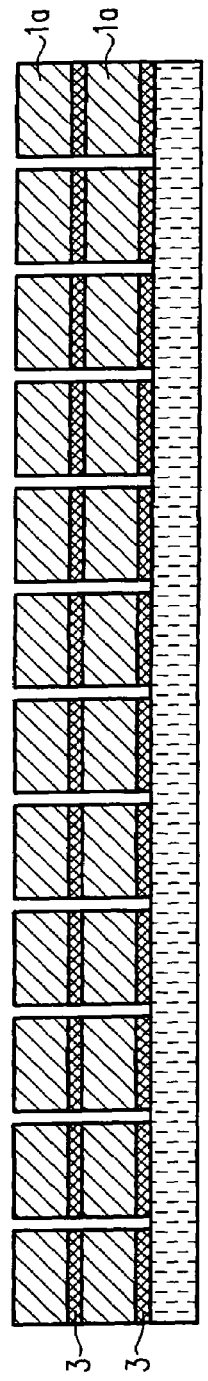

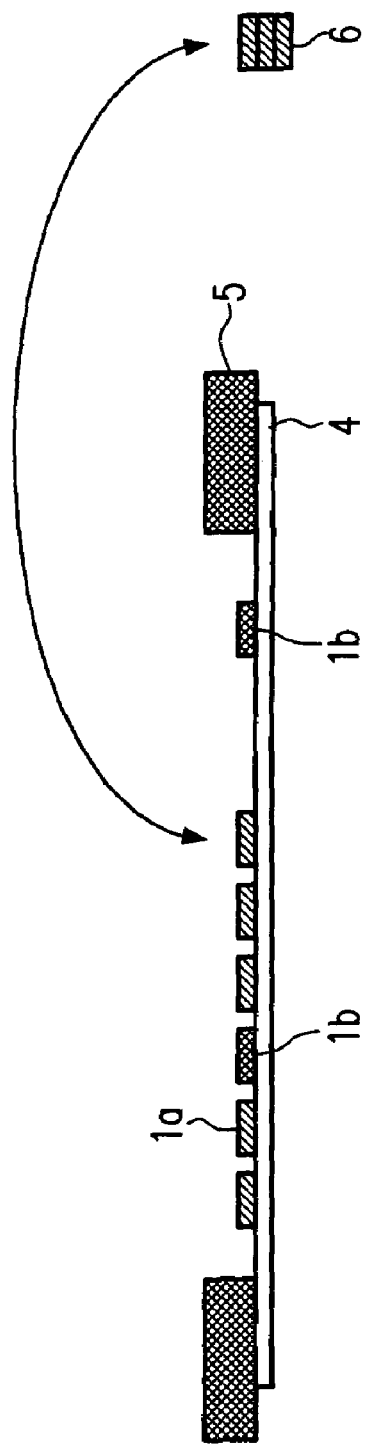

METHOD FOR GENERATING CHIP STACKS

CROSS REFERENCE TO RELATED APPLICATIONS

This application claims the benefit of the filing date of German patent application 10342980.8, entitled "Method for Generating Chip Stacks," filed on Sep. 17, 2003, the disclosure of which is incorporated herein by reference.

TECHNICAL FIELD

Aspects of this invention relate in general to a method for generating chip stacks. In particular, aspects of the invention relate to a method for generating chip stacks during the production of chips from wafers, the chips located on the wafer being separated from one another, the wafer being ground thin and the chips being stacked to form chip stacks, the individual chips being subjected to a functional check in the course of the method.

BACKGROUND INFORMATION

During the production and further processing of chips, chip stacks are generated in order to increase the component density of the components. Such chip stacks (3D packages) are to include only functional chips (good chips).

It is known to electrically measure the wafers first in order to be able to distinguish good chips from unusable bad chips and to sort out the bad chips subsequently. For this purpose, after separation and thin grinding the chips are put on a carrier foil, the good chips are picked up, whereas the bad chips remain on the carrier foil. The drawback of this procedure is that for assembling the chips a serial process is used which is very time-consuming. The chip contacting devices (diebonder) used for this process step—if they have an output suitable for production—do not have the positioning accuracy of the chips necessary for the subsequent throughplating. On the other hand, chip contacting devices having a sufficient positioning accuracy do not achieve the output required for a production. Consequently, it is not possible in a satisfying way to pick up the individual good chips and stack them during running production.

Another known procedure is to generate chip stacks first by assembling the wafers on one another. In a subsequent step, those chip stacks are sorted out which contain defect chips (bad chips). A drawback of this procedure is that although the yield with regard to the wafers used is good, the number of faultless chip stacks is accordingly low.

Another known procedure is to unmatch the wafers first and to replace bad chips by good chips. In a further work step, the chips are then assembled on pre-existing chip stacks. The drawback of this procedure is that during unmatching the position of the chips on the carrier foil changes. This results in high position tolerances during the subsequent assembly of the chips. The chip stacks thus may not have the positioning accuracy necessary for a subsequent throughplating.

SUMMARY

In response to these and other problems, in one embodiment, there is disclosed methods for generating chip stacks during the production of chips from wafers, the chips located on the wafer being separated from one another, the wafer being ground thin and the chips being stacked to form chip stacks, the chips being checked for the purpose of a functional check, wherein the chips are checked in a first work step, that adhesive material is applied on the good chips, whereas the bad chips are not provided with adhesive material, that the wafer is assembled and ground thin afterwards and that the bad chips are subsequently removed and replaced by good chips.

It is the object of some aspects of the present invention to provide a method of the kind stated above which has a simple design and can be carried out in a simple and cost-saving way and enables chip stacks to be generated while avoiding the drawbacks of the known art.

According to some aspects of the invention it is thus provided that the chips are first checked in a first work step. Subsequently, an adhesive material (tape) is applied on the good chips, whereas the bad chips are not provided with an adhesive material. The wafer may then be assembled and afterwards ground thin. During the subsequent further processing the bad chips may thus be removed and replaced by good chips in a most simple way.

Certain aspects of the invention may have a number of considerable advantages.

According to some aspects of the invention, the chips are contacted in a wafer compound. Thus, the contacting can be carried out simultaneously. As a result of this a high output is achieved. Likewise, subsequent process steps such as electrical contacting between the chips in the stack may also be carried out simultaneously.

Another advantage of some aspects of the invention, is that the chips exhibit the position tolerance common on the wafer. As a result of this, a sufficiently high position accuracy for the subsequent throughplating is achieved. According to some aspects of the invention, it is possible in a most simple way to exchange defect chips (bad chips) and replace same by good chips. This results in the advantage that the yield with regard to the chip stacks is not reduced, since all chip stacks are only composed of good chips.

Another advantage results from that diebonders having a high positioning accuracy may be used to replace the defect chips (bad chips). However, their slow clock frequency does not affect the overall output of the production method.

According to some aspects of the invention, it is favourable if after separation of the chips on the wafer only the good chips are provided with the adhesive material (tape). Only these chips subsequently adhere on the carrier, so that the bad chips, which are thus not provided with the adhesive material, may be removed easily.

In other modified embodiments of the invention, it is provided that the bad chips are also provided with adhesive material first, which is then, however, deactivated. Alternatively, it is also possible to provide the bad chips with adhesive material first, but to remove same subsequently before the chip stacks are generated.

In a further embodiment of the invention, it may be provided that the good chips are provided with the adhesive material before separation and are separated subsequently. This results in a precise cut edge of both the chips and the adhesive material (tape).

According to some aspects of the invention, the selective coating of the chips with a glueing layer or the selective removal or deactivation of this layer, respectively, is always carried out such that adjacent chips and adjacent areas of adhesive material are separated from one another by a gap. As a result of this, the glueing and non-glueing areas are clearly separated from one another. It is thus prevented, for example, that the curing process, which is started upon deactivation of the adhesive layer by UV light, is transmitted to unexposed areas or areas of the adhesive material not to be exposed.

These and other features, and advantages, will be more clearly understood from the following detailed description taken in conjunction with the accompanying drawings. It is important to note the drawings are not intended to represent the only aspect of the invention. Furthermore, any advantages and benefits described may not apply to all embodiments of the invention.

BRIEF DESCRIPTION OF THE DRAWINGS

FIG. 3 is a schematic representation of the process during replacing bad chips by good chips, FIG. 4 shows another work step during placement of another wafer upon the carrier to generate chip stacks, FIG. 5 shows the chip stacks resulting from the work step of FIG. 4, and FIG. 6 is a schematic representation of a known procedure.

DETAILED DESCRIPTION

Figure 1:
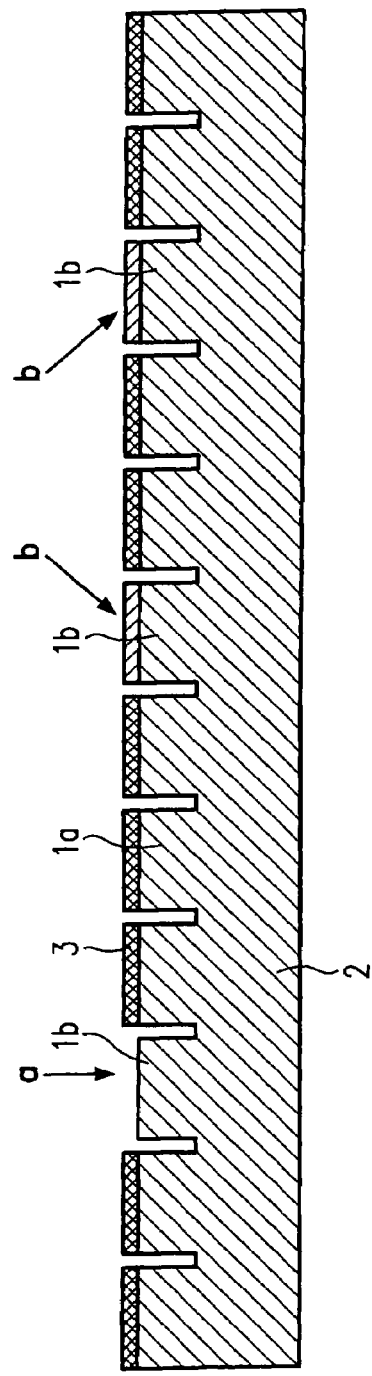
FIG. 1 is a schematic side view of a wafer having separating cuts as well as adhesive material partially applied thereon.

For the purposes of promoting an understanding of the principles of the present inventions, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the inventions as described herein are contemplated as would normally occur to one skilled in the art to which the invention relates.

For the most part, details unnecessary to obtain a complete understanding of the present invention have been omitted inasmuch as such details are within the skills of persons of ordinary skill in the relevant art.

With reference to FIG. 6, it is known to lay unmatched chips down on a carrier or a carrier foil 4 which may be provided with a frame 5. As can be seen from the drawing, the arrangement may comprise good chips 1a and bad chips 1b. As is shown, good chips 1a are taken out individually and assembled to form a chip stack 6.

FIG. 1 shows an embodiment of the solution according to one aspect of the invention in which a wafer 2 is cut on the active side. The grooves thus produced separate individual chips 1. Subsequently, the good chips 1a are provided with an adhesive material 3, whereas bad chips 1b are not provided with adhesive material, as is represented by the arrow "a." Alternatively, the bad chips may also be provided with adhesive material, which is subsequently deactivated (arrows "b").

As an alternative embodiment of the invention it is also possible to first provide the wafers completely with the glueing layer (adhesive material 3) on the active side and to carry out the sawing or separation, respectively, subsequently. In this alternative embodiment the adhesive material 3 (glueing layer) is either removed from the bad chips 1b subsequently (see schematic representation of arrow a) or the adhesive mechanism is deactivated (see schematic representation of arrows b).

Figure 2:
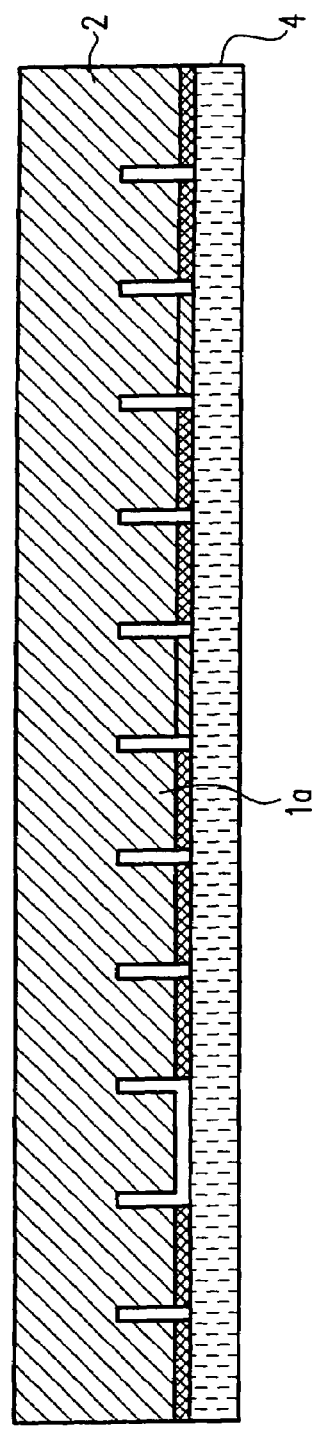
FIG. 2 is a schematic view of the arrangement shown in FIG. 1, which was turned and placed upon a carrier.

Subsequently, the wafer, as is shown in FIG. 2, is turned and contacted on the carrier 4. The rear surface of the wafer can now be ground thin. As a result of this, the individual chips 1 are unmatched as is schematically represented in FIG. 3. The bad chips 1b not provided with adhesive material have already been removed according to the representation in FIG. 3. As is indicated by the arrows, good chips 1a are placed for same.

As is shown in FIG. 4, in a subsequent work step the next wafer, the good chips 1a of which have also already been provided with adhesive material 3, is placed. Wafer 2 is then also ground thin, so that after exchange of the bad chips, which are then not adhesive, by good chips analogous to FIG. 3 the arrangement of FIG. 5 results.

According to the invention, a selective glueing of wafers is thus provided, so that defect chips may be replaced by good chips. Exchanging the chips is thus possible at every site during the generation of the chip stacks. Since the wafers are first cut from the active side and then assembled and made thinner, the bad chips may be removed in a most simple way.

In order to clearly separate glueing areas from non-glueing areas, either the cut chips are provided with a glue layer or the glue layer is unmatched together with the chips during the cutting.

The deactivation of the adhesive material 3 on the bad chips (arrows b according to FIG. 1) may be carried out by UV irradiation, for example.

The removal of individual areas of adhesive material 3 may be carried out after the application of adhesive material (tape) to the entire surface of the wafer and the separation of the individual areas of the adhesive material and by subsequent removal of this adhesive material.

The chip stacks according to the invention are particularly characterised in that the edge of the glueing layer corresponds to the chip front surface and that there is no apparent angle displacement between the individual chips of a chip stack. In addition to that, according to the invention there is practically no visible chipping of the rear surface, i.e. sawing of the chips does not result in spallings, since the chips are unmatched during thin grinding.

The abstract of the disclosure is provided for the sole reason of complying with the rules requiring an abstract, which will allow a searcher to quickly ascertain the subject matter of the technical disclosure of any patent issued from this disclosure. It is submitted with the understanding that it will not be used to interpret or limit the scope or meaning of the claims.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for generating chip stacks during the production of chips from wafers, the method comprising:
   a. providing a first wafer having an active side and a non-active side, wherein the first wafer has a plurality of chips;
   b. testing the plurality of chips to determine a plurality of functional chips and a plurality of non-functional chips;

c. forming grooves on the active side of the first wafer to partially separate the plurality of chips;

d. creating adhesive surfaces only on the active sides of the plurality of functional chips;

e. positioning the first wafer so that the adhesive surfaces of the first wafer contacts a carrier such that chips having an adhesive surface adhere to the carrier;

f. grinding the non-active side of the first wafer down to the grooves to separate the plurality of chips so that the plurality of non-functional chips are not adhered to the carrier; and g. replacing the non-functional chips with functional chips, wherein the function chips have adhesive surfaces which adheres to the carrier.

2. The method of claim 1, further comprising:

h. providing a second wafer having an active side and a non-active side, wherein the second wafer has a plurality of chips;

i. testing the plurality of chips of the second wafer to determine a plurality of functional chips and a plurality of non-functional chips;

j. forming groves on the active side of the second wafer to partially separate the plurality of chips of the second wafer;

k. creating adhesive surfaces only on the active sides of the plurality of functional chips of the second wafer;

l. positioning the second wafer such that the adhesive surfaces of the second wafer adheres to the non-active side of the first wafer;

m. grinding the non-active side of the second wafer down to the grooves to separate the plurality of the chips;

n. replacing the non-functional chips with functional chips for the second wafer, wherein the function chips have adhesive surfaces which adhere to the first wafer, thus producing a plurality of chip stacks.

3. The method of claim 2, further comprising adding additional chips to the plurality of chip stacks by repeating steps h through n for additional wafers.

4. The method of claim 1, wherein the step of creating adhesive surfaces further comprises applying an adhesive material only to the active side of each chip of the plurality of functional chips.

5. A method for generating chip stacks during the production of chips from wafers, the method comprising:

a. providing a first wafer having an active side and a non-active side, wherein the first wafer has a plurality of chips;

b. testing the plurality of chips to determine a plurality of functional chips and a plurality of non-functional chips;

c. forming grooves on the active side of the first wafer to partially separate the plurality of chips;

d. applying an adhesive material to the plurality of functional and the plurality of non-functional chips, deactivating the adhesive material on the plurality of non-functional chips e. positioning the first wafer so that the adhesive surfaces of the first wafer contacts a carrier such that the chips having an adhesive surface adhere to the carrier;

f. grinding the non-active side of the first wafer down to the grooves to separate the plurality of chips so that the plurality of non-functional chips are not adhered to the carrier; and g. replacing the non-functional chips with functional chips, wherein the functional chips have adhesive surfaces which adhere to the carrier.

6. A method for generating chip stacks during the production of chips from wafers, the method comprising:

a. providing a first wafer having an active side and a non-active side, wherein the first wafer has a plurality of chips;

b. testing the plurality of chips to determine a plurality of functional chips and a plurality of non-functional chips;

c. forming grooves on the active side of the first wafer to partially separate the plurality of chips;

d. applying an adhesive material to the plurality of functional and the plurality of non-functional chips, removing the adhesive material on the plurality of non-functional chips e. positioning the first wafer so that the adhesive surfaces of the first wafer contacts a carrier such that the chips having an adhesive surface adhere to the carrier;

f. grinding the non-active side of the first wafer down to the grooves to separate the plurality of chips so that the plurality of non-functional chips are not adhered to the carrier; and g. replacing the non-functional chips with functional chips, wherein the functional chips have adhesive surfaces which adhere to the carrier.

* * * * *